United States Patent

Ogawa et al.

Patent Number: 5,077,544
Date of Patent: Dec. 31, 1991

[54] LADDER-TYPE PIEZOELECTRIC FILTER HAVING HIGHER INPUT AND OUTPUT QM VALUES

[75] Inventors: Tatsuo Ogawa, Kagamihara; Takesumi Nagai, Nagoya, both of Japan

[73] Assignee: NGK Spark Plug Co., Ltd., Nagoya, Japan

[21] Appl. No.: 362,943

[22] Filed: Jun. 8, 1989

[30] Foreign Application Priority Data

Jun. 13, 1988 [JP] Japan .................. 63-144989

[51] Int. Cl.$^5$ .................................. H03H 9/205
[52] U.S. Cl. ...................... 333/189; 310/311
[58] Field of Search ............ 333/188, 189, 191, 192, 333/32; 310/320-322, 311

[56] References Cited

U.S. PATENT DOCUMENTS

| | | | |
|---|---|---|---|
| 3,517,350 | 6/1970 | Beaver | 333/32 X |
| 4,353,045 | 10/1982 | Matsui et al. | 333/189 X |
| 4,398,162 | 8/1983 | Nagai | 333/189 |
| 4,841,264 | 6/1989 | Oshikawa | 333/189 |

FOREIGN PATENT DOCUMENTS 63046 5/1977 Japan .................. 333/189

OTHER PUBLICATIONS

Jumonji, H.; "High inpedence piezoelectric ceramic resonators and their application to ladder filters"; *Electronics and Communication in Japan,*; vol. 53-A, No. 8; 1970; pp. 17-23.

*Primary Examiner*—Eugene R. LaRoche
*Assistant Examiner*—Benny Lee
*Attorney, Agent, or Firm*—Brady, O'Boyle & Gates

[57] ABSTRACT

A ladder-type piezoelectric filter having a plurality of piezoelectric resonator elements connected to a series branch and a plurality of piezoelectric resonator elements connected to a parallel branch wherein each of the series and parallel piezoelectric resonator elements positioned on the input and output terminal sides, respectively, has a Qm value larger than that of the remaining series and parallel piezoelectric resonator elements, thereby improving a group delay frequency characteristic while suppressing any increment of an insertion loss.

2 Claims, 3 Drawing Sheets

LADDER-TYPE PIEZOELECTRIC FILTER HAVING HIGHER INPUT AND OUTPUT QM VALUES

BACKGROUND OF THE INVENTION

The present invention relates to a ladder-type piezoelectric filter having a plurality of piezoelectric resonator elements for a series branch and a plurality of piezoelectric resonator elements for a parallel branch, wherein each of the series piezoelectric resonator elements has an electrostatic capacitance which is different from that of each of the parallel piezoelectric resonator elements.

There have been proposed various arrangements of such a ladder-type piezoelectric filter. An example of such conventional piezoelectric filter is disclosed in U.S. Pat. No. 4,398,162, in which a plurality of piezoelectric resonator elements each having a relatively smaller electrostatic capacitance are connected to a series branch, and a plurality of piezoelectric resonator elements each having a relatively larger electrostatic capacitance, are connected to a parallel branch. Similar filter arrangement is disclosed in U.S. Pat. No. 4,353,045.

Recently, a digital communication system has been provided for telephone sets for vehicles, MCA (multichannel access) transmitter or the like. There is an increasing demand that the ladder-type piezoelectric filter to be used for such a digital communication system should have an excellent group delay frequency characteristic.

It is known that the group delay frequency characteristic of the ladder-type piezoelectric filter can be improved by decreasing Qm value thereof. That is, FIGS. 1 to 5 show amplitude characteristics (A) and group delay frequency characteristics (B) of the prior art ladder-type piezoelectric filter of a nine-element type with respect to different Qm values of 100, 200, 300, 400 and 600, in which the piezoelectric resonator elements in the series branch have an electrostatic capacitance of 70-150 pF and the piezoelectric resonator elements in the parallel branch have an electrostatic capacitance of 400-600 pF. It is appreciated that the best group delay frequency characteristic may be obtained when the Qm value is set to 100 as shown in FIG. 1.

To the contrary, it will be seen that an insertion loss of the ladder-type piezoelectric filter may be increased as the Qm value is smaller. FIG. 6 shows the insertion loss (dB) for different Qm values determined using the same samples as mentioned above. As will be seen from FIG. 6, the insertion loss is abruptly increased in the vicinity of the Qm value of 200, and has an extremely high level in the vicinity of the Qm value of 100. In general, it is necessary that the upper limit of the insertion loss is practically less than 9 dB. In order to fulfill this demand, the Qm value should be set to 200 or more.

It is, therefore, difficult to provide a ladder-type piezoelectric filter which fulfills the requirements of an excellent group delay characteristic and a lower insertion loss.

SUMMARY OF THE INVENTION

It is therefore an object of the present invention to provide a ladder-type piezoelectric filter capable of overcoming the problems or disadvantages of the conventional filters, and fully meeting the requirements for an excellent group delay characteristic and a lower insertion loss.

According to the present invention, there is provided a ladder-type piezoelectric filter comprising a series branch and a parallel branch each including a plurality of piezoelectric resonator elements, the piezoelectric resonator elements in the series branch positioned on an input and output terminal sides having Qm value larger than that of the remaining intermediately positioned piezoelectric resonator elements in the series branch, and the piezoelectric resonator elements in the parallel branch positioned on an input and output terminal sides having Qm value larger than that of the remaining intermediately positioned piezoelectric resonator elements in the parallel branch.

Preferably, the Qm value of the piezoelectric resonator elements in the series branch positioned on an input terminal side and an output terminal side may be at least 1.5 times, preferably 3 times or more, as large as that of the remaining intermediately positioned piezoelectric resonator elements in the series branch, and the Qm value of the piezoelectric resonator elements in the parallel branch positioned on an input terminal side and an output terminal side may be at least 1.5 times, preferably 3 times or more, as large as that of the remaining intermediately positioned piezoelectric resonator elements in the parallel branch.

It will be appreciated that the piezoelectric resonator elements in the series and parallel branches may be connected to form a L-connection type, a T-connection type or a $\pi$-connection type filter circuit.

The present invention will now be described by way of example with reference to the accompanying drawings:

DETAILED DESCRIPTION

Figure 1:
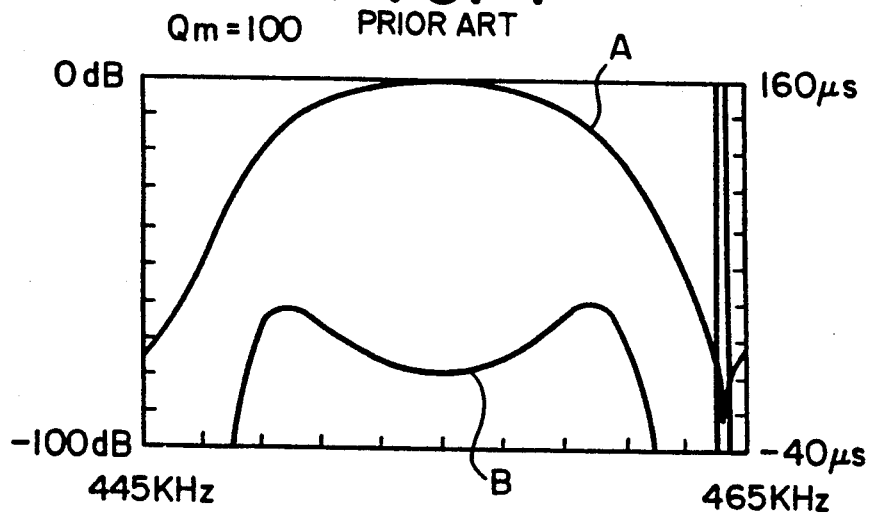
FIGS. 1 to 5 are graphs showing the amplitude characteristics and the group delay frequency characteristics of a conventional prior art ladder-type piezoelectric filter for different Qm values of the piezoelectric resonator elements.
Figure 2:
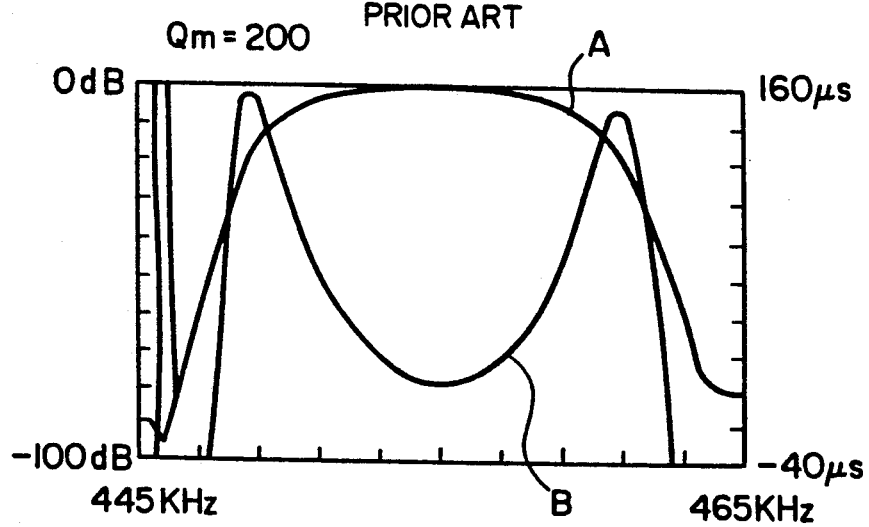
Figure 3:
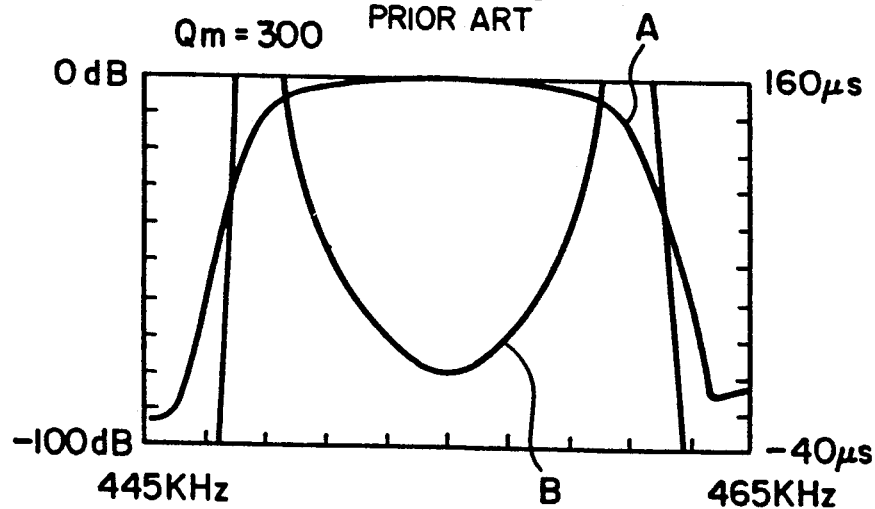
Figure 4:
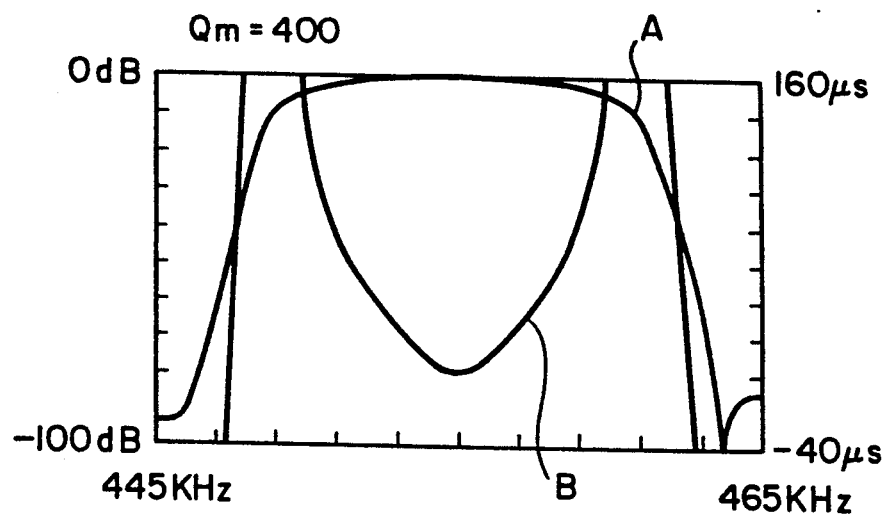
Figure 5:
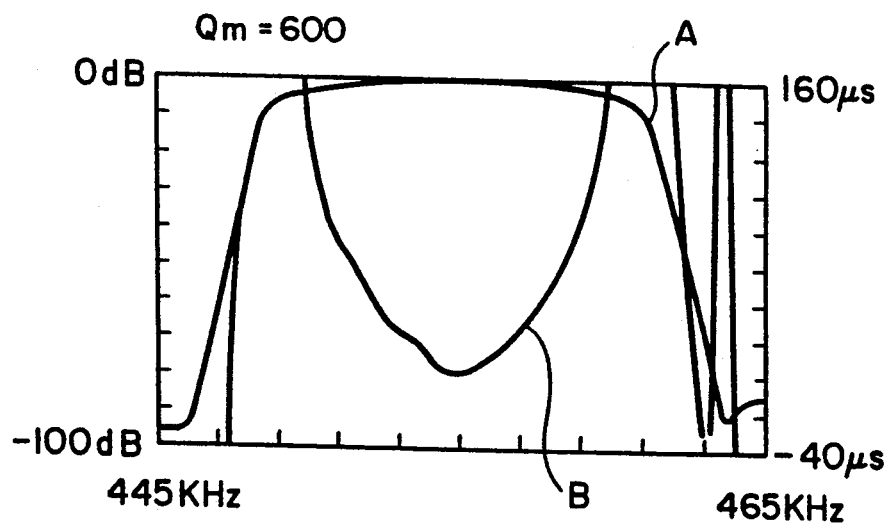
Figure 6:
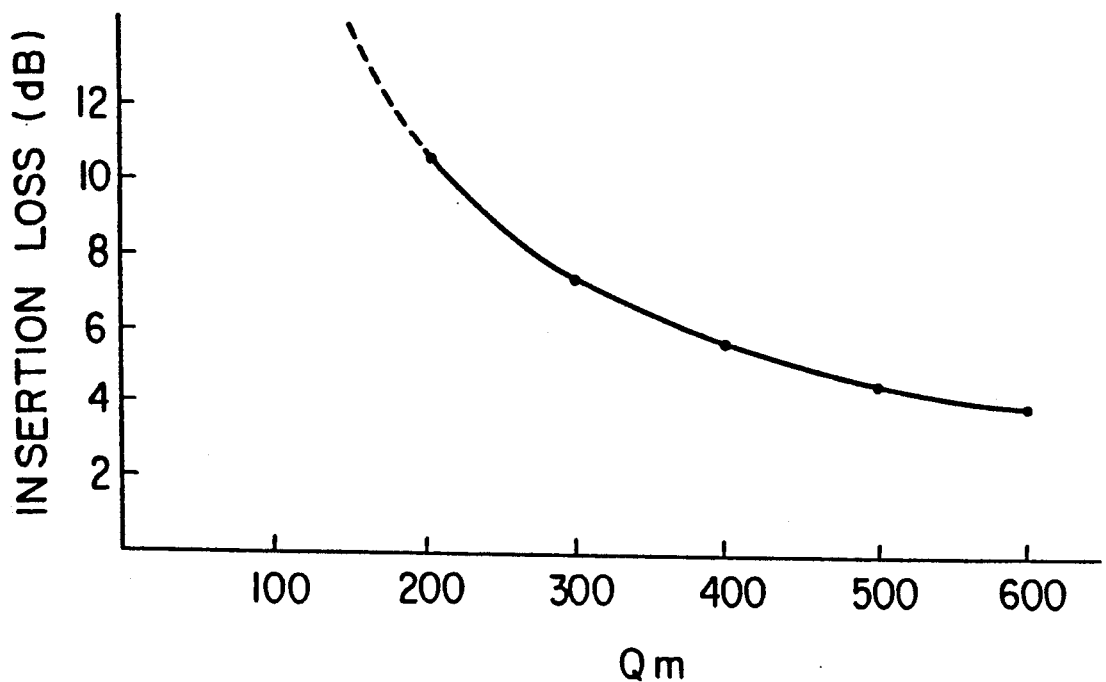
FIG. 6 is a graph showing the insertion loss for different Qm values of the piezoelectric resonator elements.
Figure 7:
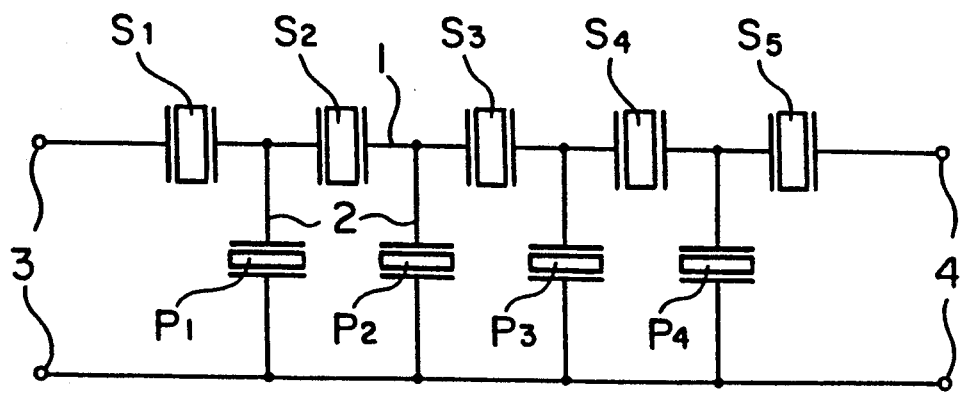
FIG. 7 is an equivalent circuit diagram of an embodiment of a ladder-type piezoelectric filter constructed as a nine-element type according to the present invention.

Referring to FIG. 7, there is shown a ladder-type piezoelectric filter constructed to form a nine-element type filter in accordance with the present invention. The illustrated filter comprises five piezoelectric resonator elements S1 to S5 connected to form a series branch 1, four piezoelectric resonator elements P1 to P4 connected to form a parallel branch 2, input terminals 3 and output terminals 4. Each of the piezoelectric resonator elements may be constructed by a rectangular shaped plate of lead titanate zirconate or the like material. Each resonator plate has a central frequency of 455 KHz and a size of 4.5-4.7 mm wide and long, and 0.35-0.60 mm in thickness. By adjusting the area of the electrode on both major surfaces in each of the resonator plates, they are set to have an electrostatic capacitance which is suitable for the series branch or the parallel branch, and then are connected or assembled to form the ladder-type piezoelectric filter of a nine-element type as shown in FIG. 1. The connected or assembled resonator elements are so arranged that the piezoelectric resonator elements S1 and S5 in the series branch, positioned on an input terminal side, and an output terminal side, have a Qm value larger than that of the remaining intermediately positioned piezoelectric resonator elements S2, S3 and S4 in the series branch, and the piezoelectric resonator elements P1 and P4 in the parallel branch, positioned on an input terminal side, and an output terminal side, have a Qm value larger than that of the remaining intermediately positioned piezoelectric resonator elements P2 and P3 in the parallel branch.

In order to compare the ladder-type piezoelectric filter thus constructed in accordance with the present invention with the conventional one having the same arrangement as shown in FIG. 7, three types of samples were prepared and the group delay frequency and the insertion loss thereof were determined. The results are shown in following Table, wherein FA represents an anti-resonance frequency, FR a resonance frequency, dF the difference between the anti-resonance frequency (FA) and the resonance frequency (FR), and CX and electrostatic capacitance.

prising five piezoelectric resonator elements branched in series and four piezoelectric resonator elements branched in parallel. However, the present invention may equally be applied to any other type filter having more or less than nine elements.

As described above, by selecting the Qm values of the piezoelectric resonator elements in the series and parallel branches positioned on an input terminal side and an output terminal side larger than that of the remaining intermediately positioned piezoelectric resonator elements in the these branches, respectively, the present invention can provide a ladder-type piezoelectric filter with excellent group delay characteristic and a lower insertion loss, which is fully compatible with a digital communication system for telephone sets for vehicles, MCA transmitter or the like.

It is to be understood that the above-mentioned embodiments are only illustrative of the application of the principles of the present invention. Numerous modifications and alterations may be made by those skilled in the art without departing from the spirit and scope of the invention, and the appended claims are intended to cover such modifications and alterations.

TABLE

| SAMPLE No. | PIZOELECTRIC RESONATOR ELEMENTS | | | | | FILTER ASSEMBLIES | | NOTE |
| | No. | FA (KHz) | FR (KHz) | dF (KHz) | CX (pF) | Qm | INSERTION LOSS | GROUP DELAY FREQUENCY | |
|---|---|---|---|---|---|---|---|---|---|
| 1 | S1 | 476.50 | 455.00 | 21.5 | 150 | 600 | 8.08 dB | 56.69 μsec | The present invention |
|   | S2 | 464.30 | 454.80 | 9.5 | 80 | 200 | | | |
|   | S3 | 465.30 | 454.80 | 10.5 | 80 | 200 | | | |
|   | S4 | 466.30 | 454.80 | 11.5 | 80 | 200 | | | |
|   | S5 | 476.50 | 455.00 | 21.5 | 150 | 600 | | | |
|   | P1 | 454.80 | 440.30 | 14.5 | 470 | 550 | | | |
|   | P2 | 454.50 | 445.00 | 9.5 | 600 | 150 | | | |
|   | P3 | 454.50 | 445.00 | 9.5 | 600 | 150 | | | |
|   | P4 | 454.80 | 440.30 | 14.5 | 470 | 550 | | | |
| 2 | S1 | 476.50 | 455.00 | 21.5 | 150 | 1500 | 7.63 dB | 56.12 μsec | The present invention |
|   | S2 | 464.30 | 454.80 | 9.5 | 80 | 200 | | | |
|   | S3 | 465.30 | 454.80 | 10.5 | 80 | 200 | | | |
|   | S4 | 466.30 | 454.80 | 11.5 | 80 | 200 | | | |
|   | S5 | 476.50 | 455.00 | 21.5 | 150 | 1500 | | | |
|   | P1 | 454.80 | 440.30 | 14.5 | 470 | 1500 | | | |
|   | P2 | 454.50 | 445.00 | 9.5 | 600 | 150 | | | |
|   | P3 | 454.50 | 445.00 | 9.5 | 600 | 150 | | | |
|   | P4 | 454.80 | 440.30 | 14.5 | 470 | 1500 | | | |
| 3 | S1 | 476.50 | 455.00 | 21.5 | 150 | 200 | 9.81 dB | 58.15 μsec | Conventional |
|   | S2 | 464.30 | 454.80 | 9.5 | 80 | 200 | | | |
|   | S3 | 465.30 | 454.80 | 10.5 | 80 | 200 | | | |
|   | S4 | 466.30 | 454.80 | 11.5 | 80 | 200 | | | |
|   | S5 | 476.50 | 455.00 | 21.5 | 150 | 200 | | | |
|   | P1 | 454.80 | 440.30 | 14.5 | 470 | 150 | | | |
|   | P2 | 454.50 | 445.00 | 9.5 | 600 | 150 | | | |
|   | P3 | 454.50 | 445.00 | 9.5 | 600 | 150 | | | |
|   | P4 | 454.80 | 440.30 | 14.5 | 470 | 150 | | | |

As shown by the Table, the samples 1 and 2 had a lower insertion loss than that of the sample 3 in which all of the series branch resonator elements had the same Qm value and all of the parallel branch resonator elements had the same Qm value. The results also show that the group delay frequency characteristics for all three samples were comparable.

From these experiments, it will be appreciated that specific advantages can certainly be obtained by selecting the Qm values of the piezoelectric resonator elements in the series and parallel branches positioned on an input terminal side and an output terminal side larger than that of the remaining intermediately positioned piezoelectric resonator elements in these branches, respectively. This can certainly improve the reliability of the filter circuit apparatus.

The above description has merely referred to an example of a nine-element type piezoelectric filter comprising five piezoelectric resonator elements branched

What is claimed is:

1. A ladder-type piezoelectric filter comprising, input terminals and output terminals, a plurality of series piezoelectric resonator elements connected in series between the input terminals and the output terminals, the series piezoelectric resonator elements disposed adjacent to the input and output terminals respectively having a series Qm value larger than a Qm value associated with the other series piezoelectric resonator elements, a plurality of parallel piezoelectric resonator elements coupled in parallel between the input and output, each parallel piezoelectric resonator element is respectively connected in parallel between adjacent series resonators and ground, and the parallel piezoelectric resonator elements disposed adjacent to the input and output terminals having a parallel Qm value larger than a Qm value associated with other parallel piezoelectric resonator elements.

2. A ladder-type piezoelectric filter comprising, input terminals and output terminals, a plurality of series piezoelectric resonator elements connected in series between the input terminals and the output terminals, the series piezoelectric resonator elements disposed adjacent to the input and output terminals respectively having a series Qm value larger than a Qm value associated with the other series piezoelectric resonator elements, a plurality of parallel piezoelectric resonator elements coupled in parallel between the input and output, each parallel piezoelectric resonator element is respectively connected in parallel between adjacent series resonators and ground, the parallel piezoelectric resonator elements disposed adjacent to the input and output terminals having a parallel Qm value larger than a Qm value associated with other parallel piezoelectric resonator elements, and the Qm values of the series and parallel piezoelectric resonator elements disposed adjacent to the input and output terminals being set to at least 1.5 times as large as the corresponding Qm value associated with the other series and parallel piezoelectric resonator elements.

* * * * *